United States Patent [19]

Watakabe et al.

[11] Patent Number: 4,722,878
[45] Date of Patent: Feb. 2, 1988

[54] PHOTOMASK MATERIAL

[75] Inventors: Yaichiro Watakabe; Kazuhiro Tanaka; Masahiro Hirosue, all of Itami, Japan

[73] Assignee: Mitsubishi Denki Kabushiki Kaisha, Tokyo, Japan

[21] Appl. No.: 797,156

[22] Filed: Nov. 12, 1985

[30] Foreign Application Priority Data

Nov. 9, 1984 [JP] Japan .................. 59-237021

[51] Int. Cl.$^4$ .................. G03F 9/00; B32B 9/00; G21K 5/00
[52] U.S. Cl. .................. 430/5; 378/34; 378/35; 428/428; 428/432
[58] Field of Search .............. 428/428, 432; 430/5; 378/34, 35

[56] References Cited

U.S. PATENT DOCUMENTS

| 3,721,584 | 3/1973 | Diem | 117/212 |
|---|---|---|---|
| 4,188,444 | 2/1980 | Landau | 428/428 |
| 4,237,150 | 12/1980 | Wiesmann | 427/74 |
| 4,368,230 | 1/1983 | Mizukami et al. | 428/203 |
| 4,393,127 | 7/1983 | Greschner et al. | |
| 4,440,841 | 4/1984 | Tabuchi | |
| 4,472,237 | 9/1984 | Deslauriers et al. | |

FOREIGN PATENT DOCUMENTS 3524196 2/1986 Fed. Rep. of Germany .
0051973 5/1978 Japan .

Primary Examiner—John E. Kittle
Assistant Examiner—Patrick J. Ryan
Attorney, Agent, or Firm—Lowe, Price, LeBlanc, Becker & Shur

[57] ABSTRACT

A photomask material comprising a transparent glass substrate, a polysilicon layer formed on the transparent glass substrate, a transition metal film formed on the polysilicon layer, the metal film being capable of being etched by means of the same dry etching process as that used for the polysilicon layer, and a protective polysilicon layer formed on the transition metal film.

9 Claims, 2 Drawing Figures

PHOTOMASK MATERIAL

BACKGROUND OF THE INVENTION

1. Field of the Invention

The present invention relates to a photomask material for use in manufacture of a semiconductor device.

1. Description of the Prior Art

FIG. 1 is a diagram of a conventional photomask material which has been used in manufacturing a semiconductor device. The conventional photomask material comprises a transparent glass substrate 1, such as silica, and a metal layer 2, such as chromium, which is formed with a thickness of about 1000Å by means of an evaporation process, sputtering and the like.

A mask used for manufacturing a semiconductor device included a photography emulsion dry plate using a transparent glass substrate. However, with the advance of high integration and fining, a hard mask including a transparent glass substrate and a metal film such as chromium formed on the glass substrate has been widely used. The metal film such as chromium is generally formed by mean of an evaporation, sputtering process and the like so that the thickness thereof is about 600–800Å.

A photomask for semiconductor device is made by first applying photoresist or resist for an electron beam (EB) on to the metal film and then drawing patterns by light or electron beam, followed by the process such as development and etching.

In a case where a metal film is made of chromium, a wet etching process is generally used, in which ammonium cerium (IV) nitrate and perchloric acid are employed. On the other hand, if and when a dry etching process in case of a metal film of chromium includes the use of a mixed gas of carbon tetrachloride ($CCl_4$) and oxygen ($O_2$). In manufacturing a mask for semiconductor device, particularly having fine patterns with high integration, such as VLSI, a dry etching process having less side etch effect is preferred.

The use of a general wet etching process in manufacturing a chromium mask for a semiconductor device makes it difficult to manufacture a mask with high accuracy, because of side etching effect or the like. On the other hand, according to a dry etching process which is advantageous for a mask with high accuracy, the etching speed of chromium is less than 100Å/min and selection ratio to resist (the etching speed of chromium to etching speed of resist) is worse, which is not suitable for mass production. In addition, in case of chromium mask, joining ability between the chromium film and the silica glass substrate is so small that fine pattern is sometimes stripped off when washed.

Incidentally, Japanese Patent Application No. 42176/1981, filed Mar. 23, 1981 and laid open for public inspection Sept. 28, 1982 and Japanese Patent Application No. 42183/1981, filed Mar. 23, 1981 and laid open for public inspection Sept. 28, 1982 discloses that a silicon layer and a metal layer are deposited on a glass substrate so that a pattern of silicide is formed by an electron beam.

SUMMARY OF THE INVENTION

Accordingly, a principal object of the present invention is to eliminate the above described defects and to provide a photomask material which has high accuracy and is suitable for mass production.

Briefly stated, the present invention is directed to a photomask material comprising a transparent glass substrate, a first polysilicon layer formed on the transparent glass substrate, a metal film formed on the first polysilicon layer, the metal film being capable of being etched by means of the same dry etching process as that used for the first polysilicon layer, and a second protective polysilicon layer formed on the metal film.

According to the present invention, there is provided a photomask material which is dry-etched and has a good joining ability between a metal film such as chromium and a transparent glass substrate such as silica glass.

According to a preferred embodiment of the present invention, the metal film comprises a transition metal film.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
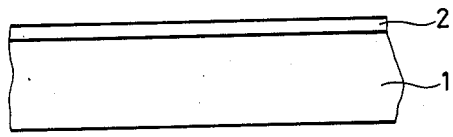
FIG. 1 is a drawing for explaining a conventional photomask material.

A transparent glass substrate used in the present invention is not limited to a specific one. In general, such transparent glass substrate may comprise silica glass, polysilicate glass (glass having low thermal expansion coefficient), soda glass or the like, having the thickness of about 1.5–3 mm. Particularly, the silica glass is preferred for the reasons described subsequently.

More particularly, silica glass comprises a silicon oxide as a main constituent element, so that joining ability between the transparent glass substrate and a polysilicon layer formed thereon is good and, in addition, there is an advantage that thermal expansion coefficient is smaller by one figure, as compared with a transparent glass.

In accordance with the present invention, a polysilicon layer formed on a transparent glass substrate (simply referred to as polysilicon layer 3 hereinafter) is a thin film having a thickness of 50–100Å, which serves to make better joining ability between the transparent glass substrate and a metal film and to decrease a stress between the metal film and the transparent glass substrate. The polysilicon layer 3 comprises a silicon in terms of its composition and is formed by means of chemical vapor deposition (CVD) process, sputtering process and the like, using silane gas.

Metal film material used in the present invention is a material which can be etched by means of the same dry etching process as that used for the polysilicon layer. Specifically, such material includes transition metal such as molybdenum (Mo), tungsten (W), titanium (Ti) which may be used singly or in combination. The metal film formed of such material is a thin film having a thickness of 600–800Å and is formed by means of sputtering process and the like. The metal film is a layer for cutting off visible light, because the polysilicon layer 3 can cut off ultraviolet radiation, but is transparent to a radiation in the visible region and hence inspection of mask such as size test and defect test becomes difficult.

After the formation of the metal film, another polysilicon layer 5 having a thickness of 100-200Å, which is the same layer as the polysilicon layer 3, is formed to protect the metal layer.

It is desirable to select, as metal film formed between the polysilicon layers 3 and 5, material which is removable by means of the same dry etching process as that used for a polysilicon layer. For example, molybdenum and tungsten can be etched, using a mixed gas of $CF_4+O_2$, in the same etching condition as that of the polysilicon layer (for example, the etching speed of about 1000Å/min in an etching condition of 300 W, 0.2 Torr). The above described structure formed by using the above described material makes possible manufacture of a strong photomask for semiconductor device and at the same time, there is obtained meritorious effect that dry etching is easily effected, as compared with a conventional photomask material using chromium. The conventional dry etching speed of chromium is about 100Å/min, which is about a tenth as compared with the present invention.

Figure 2:
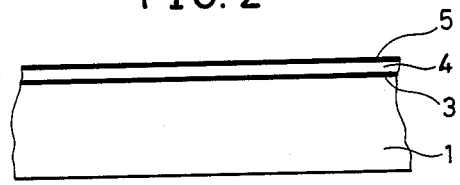
FIG. 2 is a drawing for explaining a photomask material of the present invention.

Referring to FIG. 2, a photomask material of the present invention comprises a transparent glass substrate 1 such as silica glass substrate, a polysilicon layer 3 having a thickness of about 50-100Å and formed by means of sputtering process or chemical vapor deposition process, a metal film 4 having thickness of about 600-800Å and formed of metal such as molybdenum and tungsten by means of sputtering process and a polysilicon layer 5 formed on the polysilicon layers 3 with thickness of about 100-200Å. The photomask of the present invention thus manufactured is used for formation of a hard mask.

The photomask is manufactured by applying a photoresist or resist for electron beam onto the polysilicon layer 5 of the photomask material of the present invention as shown in FIG. 2 and then drawing a pattern using light or electron beam, followed by the processes such as development and etching. In doing so, the metal film 4 can be etched at the high speed of 1000-1500Å/min by means of the same dry etching process as that for polysilicon layers 3 and 5 and hence a mass production of masks becomes possible with high accuracy and at high speed. In addition, the photomask manufactured by using the photomask material of the present invention includes the polysilicon layer 3 formed between the transparent glass substrate 1 and the metal film 4, the layer 3 having good joining ability with respect to both of the substrate 1 and the film 4, and hence patterns as formed, even if they are fine pattern, are hardly stripped off when washed. Therefore, an excellent photomask can be obtained. Now, a specific example of the photomask material of the present invention will be explained.

First of all, a silica glass substrate having thickness of about 2.3 mm was prepared. Then, a polysilicon film having a thickness of about 100Å was formed on the substrate by means of sputtering process and subsequently, a molybdenum film having a thickness about 700Å was formed thereon by means of sputtering process. In addition, as a protective film, a polysilicon film having thickness of about 200Å was formed on the molybdenum film by means of the sputtering process. As a result, a layer for photomask material having thickness of about 1000| in total was formed on the silica glass. Optical density of the material thus formed was about 3.0 which is the same value as that of the conventional chromium film.

An etching was made by a mixed gas plasma of $CF_4+O_2$ (2%). As a result, an etching speed of about 1000Å min was obtained.

The photomask material of the present invention comprises three layers formed on the transparent glass substrate, that is, a polysilicon layer, a metal film such as molybdenum and tungsten and protective polysilicon layer. Therefore, according to the present invention, a photomask material having high joining ability, that is, high reliability can be obtained. In addition, since the polysilicon layer or layers and the metal film used in the present invention can be etched at high speed by means of the same dry etching process, mass production of photomask with high accuracy becomes possible.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A photomask material comprising:
   a transparent glass substrate;
   a first polysilicon layer formed on said transparent glass substrate;
   a metal film formed on said first polysilicon layer, said metal film being formed of a metal being etched by means of the same dry etching process as that used for the first polysilicon layer; and
   a second protective polysilicon layer formed on said metal film.

2. A photomask material in accordance with claim 1, wherein
   said metal film comprises a transition metal film.

3. A photomask material in accordance with claim 2, wherein
   said transition metal film is selected from a group consisting of molybdenum, tungsten and titanium and a combination thereof.

4. A photomask material in accordance with claim 1, wherein
   said transparent glass substrate is a silica glass.

5. The photomask of claim 1, wherein said first and second polysilicon layers are each formed of the same material.

6. The photomask of claim 5, wherein said first polysilicon layer is approximately 50 to 100 Å in thickness, said metal layer being approximately 600 to 800 Å in thickness and said second polysilicon layer being approximately 100 to 200 Å in thickness.

7. The photomask of claim 6, wherein said dry etching process occurs at an etching rate of approximately 1000 Å per minute.

8. The photomask of claim 6, wherein said first and second polysilicon layers are formed by sputtering.

9. The photomask of claim 1, wherein said first and second polysilicon layers each cut off the passage of UV radiation therethrough while permitting passage of radiation in the visible region, said metal layer cutting off visible light.

* * * * *